(12) United States Patent  
Kim et al.

(10) Patent No.: US 7,449,246 B2  
(45) Date of Patent: *Nov. 11, 2008

(54) BARRIER COATINGS

(75) Inventors: Tae Won Kim, Clifton Park, NY (US); Christian Maria Anton Heller, Albany, NY (US); Marc Schaepkens, Medina, OH (US); Ahmet Gun Erlat, Clifton Park, NY (US); Min Yan, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 86 days.

This patent is subject to a terminal disclaimer.

(21) Appl. No.: 10/879,468

(22) Filed: Jun. 30, 2004

(65) Prior Publication Data

US 2006/0003189 A1    Jan. 5, 2006

(51) Int. Cl.  
    *B32B 15/00* (2006.01)  
    *B32B 17/00* (2006.01)  
    *H01J 1/62* (2006.01)  
    *H01J 63/04* (2006.01)

(52) U.S. Cl. .................. 428/451; 313/506; 313/509; 313/511; 313/512

(58) Field of Classification Search ............... 313/506, 313/509, 511, 512; 428/451  
See application file for complete search history.

(56) References Cited

U.S. PATENT DOCUMENTS

| | | | |
|---|---|---|---|
| 4,861,671 A | 8/1989 | Muchnik et al. | |
| 5,051,308 A | 9/1991 | Reed et al. | 428/412 |
| 7,015,640 B2 * | 3/2006 | Schaepkens et al. | 313/506 |
| 2003/0104753 A1 | 6/2003 | Graff et al. | |
| 2003/0205845 A1 | 11/2003 | Pichler et al. | |
| 2004/0046497 A1 | 3/2004 | Schaepkens et al. | 313/506 |
| 2004/0058157 A1 | 3/2004 | Ishikawa | 428/411.1 |
| 2004/0152390 A1 | 8/2004 | Chung et al. | |
| 2004/0209126 A1 | 10/2004 | Ziegler et al. | |
| 2004/0219380 A1 | 11/2004 | Naruse et al. | |

FOREIGN PATENT DOCUMENTS

WO    WO 98/39497    9/1998

OTHER PUBLICATIONS

Akihiro Hashimoto et al "Properties of PECVD $SiO_xN_y$ Films as Selective Diffusion Barrier", Jul. 1985. J. Electrochem. Soc.: Solid-State Science & Technology, vol. 133, No.7, pp. 1464-1467.

M.I. Alayo, et al On the nitrogen and oxygen incorporation in plasma-enhanced chemical vapor deposition (PECVD) SiOxNy films, 2002, Thin Solid Films, vol. 402, pp. 154-161.

PCT International Search Report dated Aug. 28, 2007.

* cited by examiner

*Primary Examiner*—D. S Nakarani  
(74) *Attorney, Agent, or Firm*—Duane Morris LLP

(57) ABSTRACT

A barrier coating of organic-inorganic composition, the barrier coating having optical properties that are substantially uniform along an axis of light transmission, said axis oriented substantially perpendicular to the surface of the coating.

74 Claims, 6 Drawing Sheets

BARRIER COATINGS

STATEMENT REGARDING FEDERALLY SPONSORED RESEARCH & DEVELOPMENT

This invention was made with Government support under contract number RFP01-63GE awarded by United States Display Consortium and Army Research Laboratory. The Government has certain rights in the invention.

BACKGROUND

The invention relates generally to barrier coatings. More specifically, the invention relates to barrier coatings that are used in optoelectronic devices.

Optical and optoelectronic devices that are susceptible to reactive chemical species normally encountered in the environment, require barrier coatings with desirable light transmission properties.

Multilayer barrier coatings desirably are effective barriers against reactive species like oxygen and water vapor. To achieve desired barrier properties it is known in the art to try find layers of materials of various organic and inorganic compositions. Such materials commonly have different indices of refraction, normally resulting in degradation in optical transmission through the barrier layer. Prior approaches have focused on engineering the thickness of the layers to take advantage of multiple-interference to improve light transmission efficiency. However, one has to retain certain thickness of the layers in order to maintain the performance of the barrier, and thus it is not always easy to engineer the thickness. Furthermore, in a mass production environment it is difficult to achieve exact thickness control of the layers. Also, it has been suggested that in multilayer barriers, the interface between layers of different materials is generally weak due to incompatibility of adjacent materials and the layers, thus, are prone to be delaminated.

Organic-inorganic coating compositions desirably may be used to minimize moisture and oxygen permeation rates through the barrier coating. It has been speculated that the organic zone sandwiched between two inorganic zones decouples the defects in one inorganic zone to another. Thick organic zones in the coating are effective in decoupling the defects. However, inorganic materials typically have a refractive index n about 1.8 and organic materials typically have a refractive index n about 1.5. Due to the refractive index mismatch, large amplitude interference fringes are observed with thick organic zones in the coating. Desired optical performance achieved by maintaining organic zone thickness as thin as possible, degrades the barrier properties of the coating.

Therefore, there is need for barrier coatings that are not only robust, having low diffusion rates for environmentally reactive species, but also have desirable optical properties and can easily be mass produced.

BRIEF DESCRIPTION

The present invention addresses the needs discussed above. One aspect of this invention is a composite article comprising a barrier coating of organic-inorganic composition, the barrier coating having optical properties that are substantially uniform along an axis of light transmission, said axis oriented substantially perpendicular to the surface of the coating.

Another aspect of the invention is a method for depositing an organic-inorganic barrier coating. The method comprising the steps of providing at least one surface for deposition; depositing reaction or recombination products of reacting species on the surface; changing the compositions of the reactants fed into the reactor chamber during the deposition to form a compositionally organic-inorganic coating, with at least one substantially organic zone and at least one substantially inorganic zone; and performing refractive index modification of at least one inorganic zone by varying the precursor gas composition, said refractive index of the inorganic zone being adjusted to provide a substantially uniform refractive index along an axis of light transmission through said barrier coating.

A further aspect of the invention is a device assembly comprising a device, at least one surface of which is coated with at least one barrier coating of organic-inorganic composition, the composition of which varies across the thickness of the coating and has substantially uniform refractive index along the axis of light transmission, the axis oriented substantially perpendicular to the surface of the coating.

DRAWINGS

These and other features, aspects, and advantages of the present invention will become better understood when the following detailed description is read with reference to the accompanying drawings in which like characters represent like parts throughout the drawings, wherein:

FIG. 1 graphically shows light transmittance through identical substrates having barrier coatings with and without refractive index matching.

DETAILED DESCRIPTION

Light emitting and light absorbing materials and electrode materials in optoelectronic devices, especially in organic optoelectronic devices, are all susceptible to attack by reactive species existing in the environment, such as oxygen, water vapor, hydrogen sulfide, $SO_x$, $NO_x$, solvents, etc. Barrier coatings engineered to affect light transmission only to a small extent are useful in extending the device lifetime without degrading the overall device efficiency, thus rendering them commercially viable. Desirable barrier properties are achieved in the coating of the present invention by using an organic-inorganic composition and desirable light transmission is achieved by matching refractive indices of inorganic zones and organic zones in the coating.

One aspect of this invention is a composite article comprising a barrier coating of organic-inorganic composition, the barrier coating having optical properties that are substantially uniform along an axis of light transmission oriented substantially perpendicular to the surface of the coating. "Substantially perpendicular" means within 15 degrees either side of a perpendicular to a tangent drawn at any point on the surface. In a preferred embodiment, the substantially uniform optical properties provides for a coating with a substantially uniform refractive index. "Substantially uniform refractive index" means the refractive index of any zone in the coating is within 10% of any other zone in the coating for a selected wavelength. The barrier coating preserves color neutrality by exhibiting substantially uniform light transmission. "Substantially uniform light transmission" means at any selected wavelength in a selected wavelength range, the transmission is within 10% of the average light transmission for the wavelength range, in other words, the barrier coating does not substantially differentially attenuate wavelengths within the selected wavelength range. The barrier coating is constructed with zones of various compositions. The oxygen and water vapor barrier properties are enhanced by the inorganic-organic composition. Optical loss due to interference resulting from differing refractive indices of the zones of various compositions is overcome by depositing substantially uniform refractive-index materials. The desired transmissivity is achieved by matching the refractive indices of zones in the coating.

Figure 1:
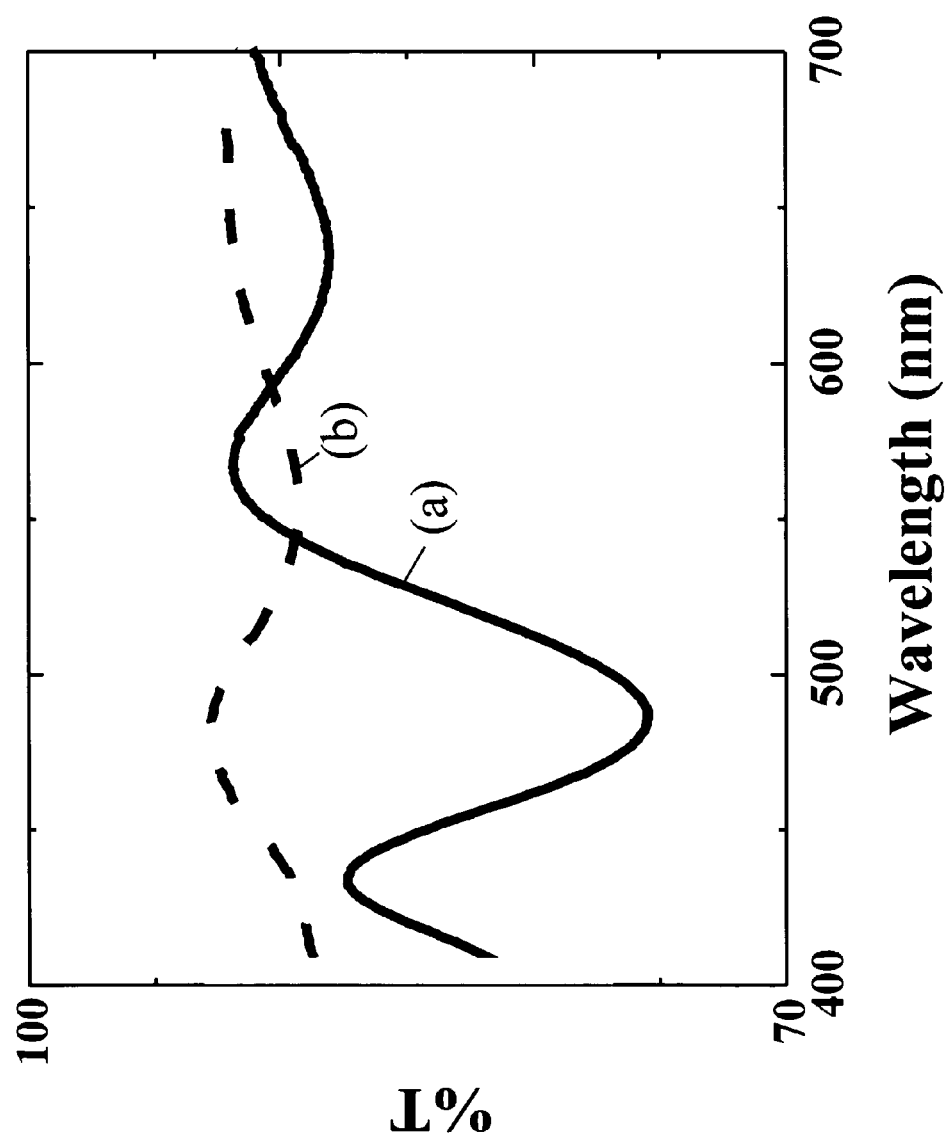

In optoelectronic devices one of the important performance parameters is optical efficiency. Therefore it is desirable that any coating used in such a device to enhance other performance parameters, does not compromise the optical efficiency due to light absorption or other factors. Therefore it is important that barrier coatings be substantially transparent. The term "substantially transparent" means allowing a total transmission of at least about 50 percent, preferably at least about 80 percent, and more preferably at least 90 percent, of light in a selected wavelength range. The selected wavelength range can be in the visible region, the infrared region and the ultraviolet region. For example, a 5 mil polycarbonate substrate with a barrier coating of the present invention, light transmittance along the axis of light transmission is greater than 85% for all wavelengths in the visible light wavelength region about 400 nanometers to about 700 nanometers. FIG. 1 compares the visible light transmittance through a substrate with a barrier coating of organic-inorganic composition without refractive index matching (a) with a refractive index matched barrier coating of organic-inorganic composition (b). FIG. 1 shows a transmittance greater than 85% for the visible wavelength with no large amplitude interference fringes for the barrier coating of the present invention. Therefore the barrier coating of the present invention is desirably substantially transparent in the visible wavelength range.

The barrier coating of the present invention consists of at least one substantially transparent inorganic zone and at least one substantially transparent organic zone having low permeability of oxygen or other reactive materials present in the environment. By low permeability it is meant that the oxygen permeability is less than about 0.1 cm$^3$/(m$^2$ day), as measured at 25° C. and with a gas containing 21 volume-percent oxygen and the water vapor transmission is less than about 1 g/(m$^2$ day), as measured at 25° C. and with a gas having 100-percent relative humidity.

Figure 2:
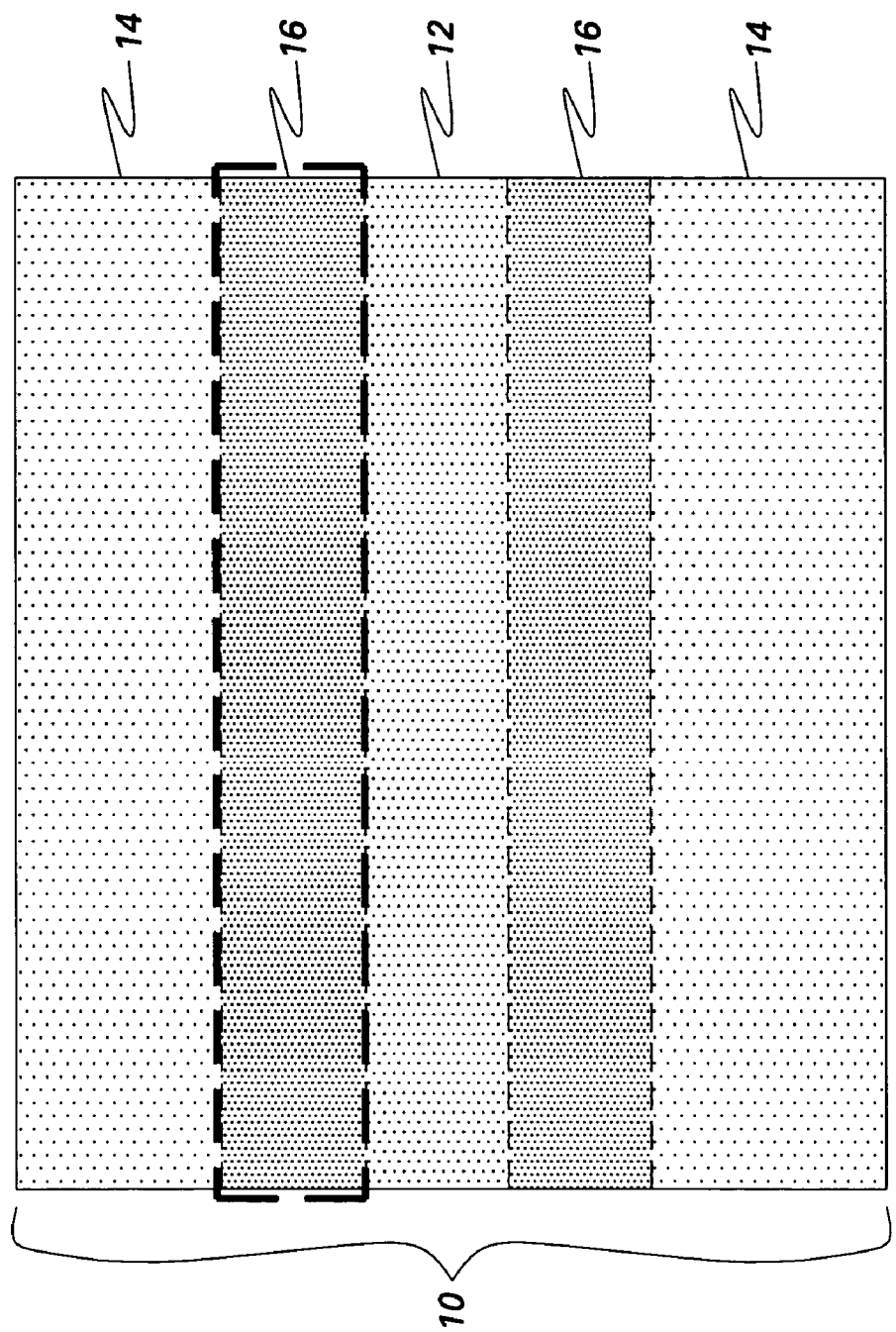
FIG. 2 shows schematically an embodiment of a barrier coating of the present invention.

Referring to drawings in general and to FIG. 2 in particular, the illustrations are for the purpose of describing an embodiment or aspect of the invention and are not intended to limit the invention. FIG. 2 shows schematically a substantially organic zone 12, a substantially inorganic zone 14 and an organic-inorganic interface zone 16 The term "substantially organic" means the composition is over 90% organic. The term "substantially inorganic" means the composition is over 90% inorganic. Although, any number of zones can be present in the barrier coating, at least two, a substantially organic zone 12 and a substantially inorganic zone 14, is suitable for reduction of moisture, oxygen and other reactive species. Typical thickness of respective substantially organic zones 12 is 100 nanometers to 1 micron. Typical thickness of respective substantially inorganic zones 14 is 10 nanometers to 100 nanometers. Typical thickness of respective transitional zones 16 is 5 nanometers to 30 nanometers. In one embodiment, the substantially organic zone 12 is of uniform composition. In another embodiment, the substantially organic zone 12 is of a composition that varies across the thickness of the zone. In another embodiment all substantially organic zones 12 in a barrier coating are of same composition. In another embodiment at least two of the organic zones 12 are of different composition. In one embodiment, the substantially inorganic zone 14 is of uniform composition. In another embodiment, the substantially organic zone 14 is of a composition that varies across the thickness of the zone. In another embodiment, all substantially organic zones 14 in a barrier coating are of same composition. In another embodiment at least two of the organic zones 14 are of different composition. Other embodiments may include transitional zones 16 that are neither substantially organic nor substantially inorganic. It should be clearly understood that the zones are not layers. The zones do not have distinct boundaries.

Thus, a coating of the present invention does not have distinct interfaces at which the composition of the coating changes abruptly. It should also be noted that the composition of the barrier coating does not necessarily vary monotonically from one surface to the other surface thereof. A monotonically varying composition is only one case of barrier coating of the present invention.

Figure 3:
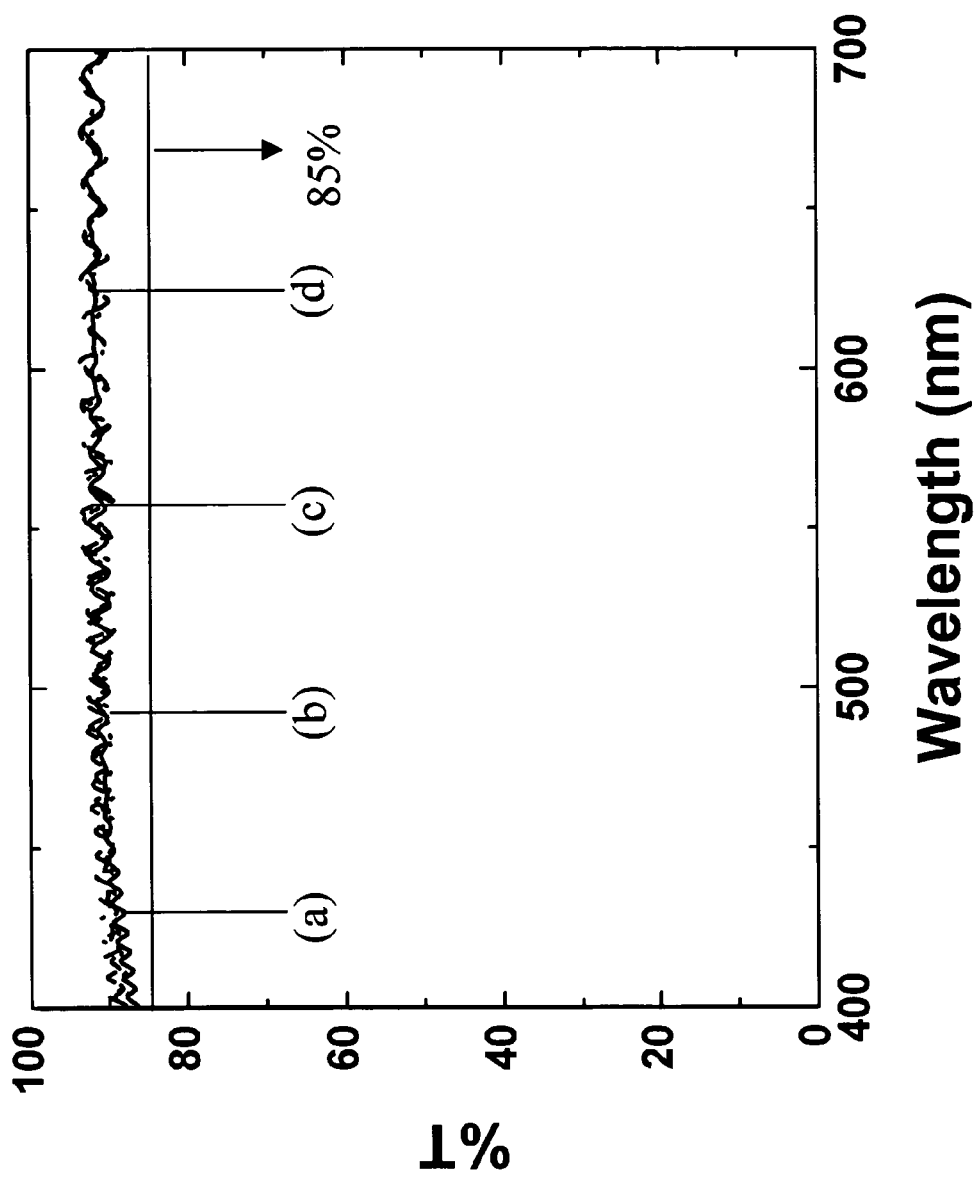
FIG. 3 shows light transmittance spectra for barrier coatings of the present invention with varying number of zones and varying zone thicknesses.

FIG. 3 shows transmission spectra for barrier coatings with varying number of zones and varying organic zone thickness. Transmission spectra as shown in FIG. 3 for barrier coatings with 100 nm silicon oxycarbide substantially organic zone between two 30 nm silicon oxynitride substantially inorganic zones (a), with 300 nm silicon oxycarbide substantially organic zone between two 30 nm silicon oxynitride substantially inorganic zones (b), with 600 nm silicon oxycarbide substantially organic zone between two 30 nm silicon oxynitride substantially inorganic zones (c) and with two 300 nm silicon oxycarbide substantially organic zone alternating with three 30 nm silicon oxynitride substantially inorganic zones, clearly demonstrate that the transmission efficiency of the barrier coating is affected only in a small way by increasing the number of zones or by increasing thickness of the organic zones in the coating. This invention thereby preserves good transmission efficiency even with thick organic zones and with multiple organic and inorganic zones, which will aid in improving the barrier properties of the coating. All barrier coatings in this example have 10 nm transitional zones between the substantially organic and substantially inorganic zones.

Suitable coating compositions of regions across the thickness are organic, and inorganic materials and combinations thereof. These materials are typically reaction or recombination products of reacting plasma species and are deposited onto the substrate surface. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals.

Figure 4:
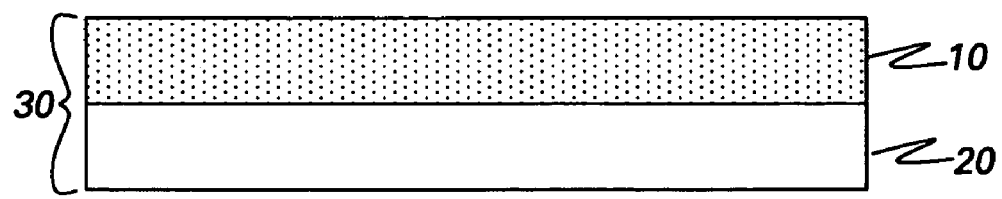
FIG. 4 shows schematically a first embodiment of a composite article with a barrier coating.
Figure 5:
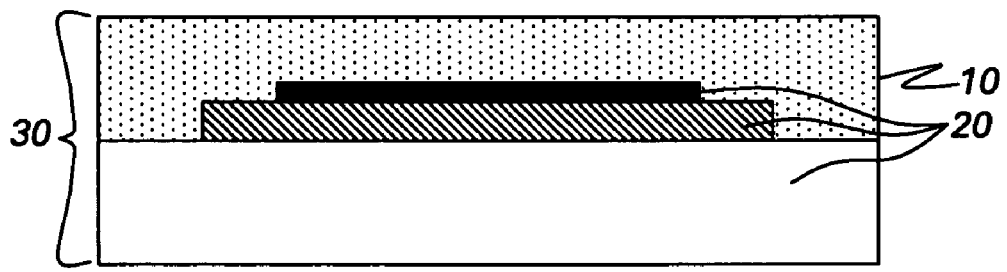
FIG. 5 shows schematically a second embodiment of a composite article with a barrier coating.
Figure 6:
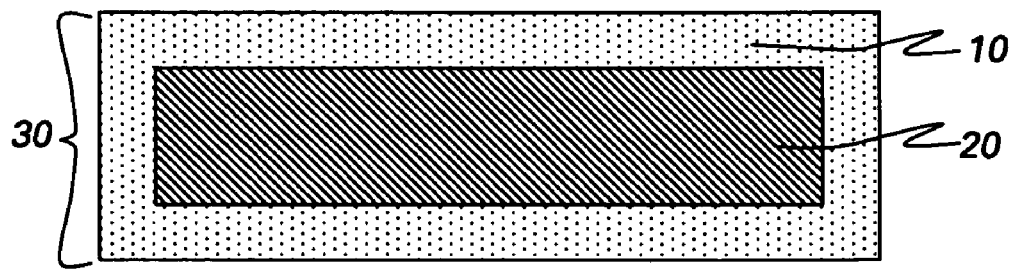
FIG. 6 shows schematically a third embodiment of a composite article with a barrier coating.

In one embodiment of the composite article of the present invention, as shown in FIG. 4, at least one barrier coating 10 is disposed on at least one surface of an element or substrate 20, of the composite article 30. In another embodiment of the composite article of the present invention, as shown in FIG. 5 at least one barrier coating 10 disposed on at least one surface of more than one element 20 of the composite article. In a third embodiment of the composite article 30 of the present invention, as shown in FIG. 6, at least one barrier coating 10 encapsulates at least one substrate or element 20 of the composite article 30.

In another embodiment of the composite article, at least one element is an optoelectronic element. In a further preferred embodiment of the composite article, the optoelectronic element is an organic element. In one embodiment of the composite article the optoelectronic element is an electroluminescent element. In another embodiment of the composite article the optoelectronic element is a photoresponsive element.

In another embodiment, the composite article includes a polymeric substrate and an active element, which is an organic electroluminescent element.

The composite article may include additional elements such as, but not limited to, an adhesion layer, abrasion resistant layer, chemically resistant layer, photoluminescent layer radiation-absorbing layer, radiation reflective layer, conductive layer, electrode layer, electron transport layer, hole transport layer and charge blocking layer.

Another aspect of the invention is a method for depositing the barrier coatings of organic-inorganic composition. The method comprising the steps of providing at least one surface for deposition, depositing reaction or recombination products of reacting species on the surface, changing the compositions of the reactants fed into the reactor chamber during the deposition to form an organic-inorganic coating with at least one substantially organic zone and at least one substantially inorganic zone, and performing refractive index modification of at least one inorganic zone by varying the precursor gas composition, the refractive index of the inorganic zone being adjusted to provide a substantially uniform refractive index along an axis of light transmission through the barrier coating A bulk material or a substrate having a surface for deposition typically is a single piece or a structure comprising a plurality of adjacent pieces of different materials. Non-limiting examples of a substrate include a rigid transparent glass and a flexible or rigid polymeric substrate.

The coating can be formed using one of many deposition techniques, such as plasma-enhanced chemical-vapor deposition, radio-frequency plasma-enhanced chemical-vapor deposition, microwave plasma enhanced chemical vapor deposition, expanding thermal-plasma chemical-vapor deposition, sputtering, reactive sputtering, electron-cyclotron-resonance plasma-enhanced chemical-vapor deposition, inductively-coupled plasma-enhanced chemical-vapor deposition, and combinations thereof. Information regarding all deposition techniques is generally known and readily available.

For example, silicon carbide can be deposited on a surface by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as Vinyl trimethylsilane (VTMS), tetraethoxysilane (TEOS), hexamethyldisiloxane (HMDSO), hexamethyldisilazane (HMDSN), or octamethylcyclotetrasiloxane (D4). Aluminum oxycarbonitride can be deposited from a plasma generated from a mixture of aluminum tartrate and ammonia. Other combinations of reactants may be chosen to obtain a desired coating composition. The choice of particular reactants is within the skills of the artisans. A mixed composition of the coating is obtained by changing the compositions of the reactants fed into the reactor chamber during the deposition of reaction products to form the coating.

Figure 7:
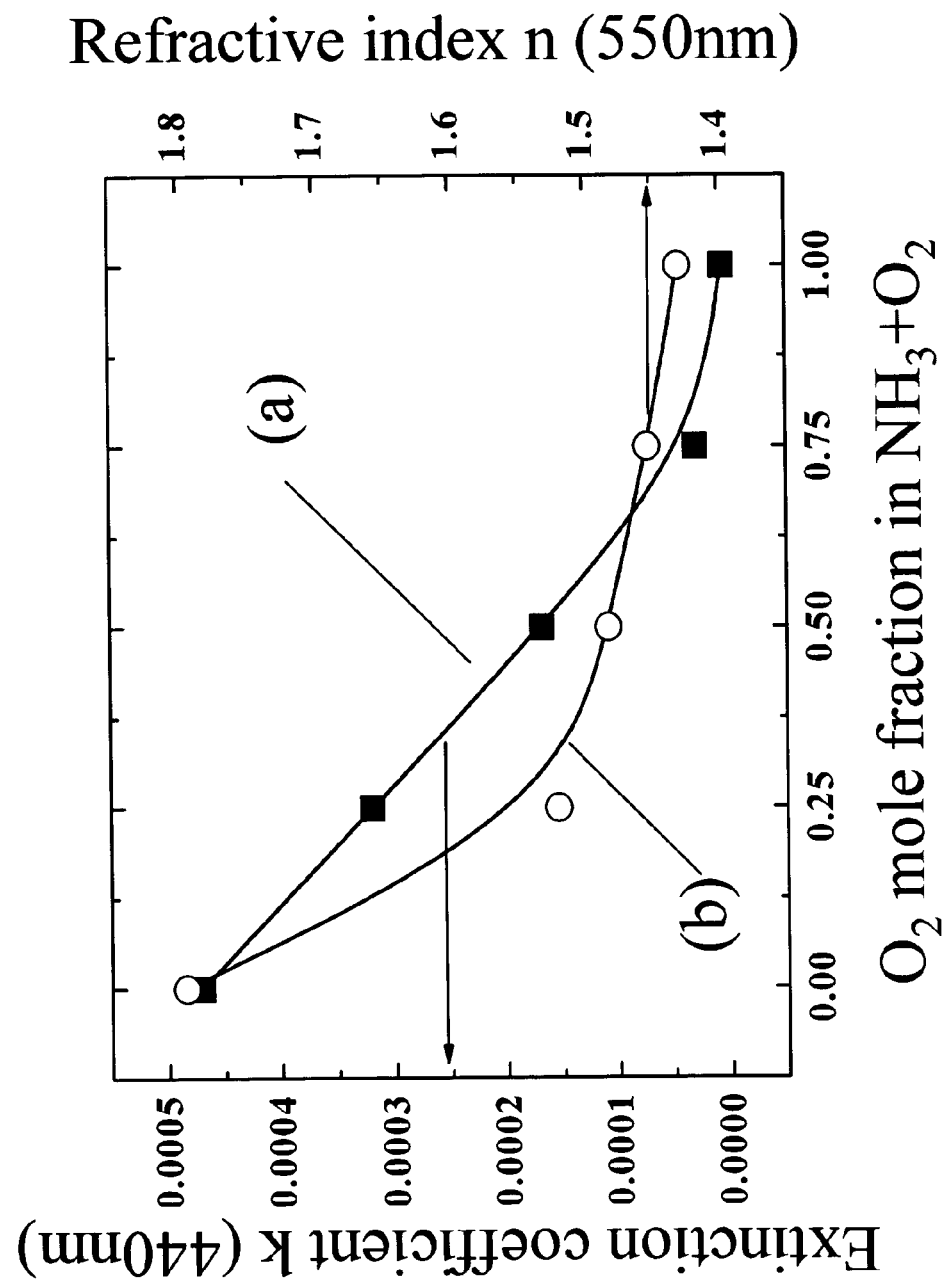
FIG. 7 shows variation in refractive index and extinction coefficient with variation in oxygen mole fraction in precursor feed gas during deposition.

For example, when the coating on a surface is desired to comprise silicon nitride, the first reactant gas can be ammonia, and the second reactant gas can be silane. The relative supply rates of reactant gases are varied during deposition to vary the composition of the deposited material as the coating is built up. If oxygen is used as an additional precursor gas, and the mole fraction of oxygen in the feed gas is increased from zero, the material deposited on the surface changes from silicon nitride to silicon oxynitride. As the oxygen mole fraction in the reactant gas increases, oxygen starts to replace nitrogen in the deposited material. Compositional and structural changes occur with increase in oxygen mole fraction, resulting in refractive index modification as well. Therefore, in this example, refractive index modification is achieved by varying the mole fraction of a constituent reactant in the precursor. FIG. 7 shows the variation of refractive index with variation in oxygen mole fraction, for a precursor composition including, ammonia and oxygen. For example, if the substantially organic zone of silicon oxycarbide having a refractive index at 550 nm of about 1.5 is used in the coating, then a substantially inorganic zone of silicon oxynitride, at an oxygen mole fraction of about 0.25, is also deposited such that the refractive index of the inorganic zone matches the refractive index of the substantially organic zone of silicon oxycarbide, resulting in a barrier coating of organic-inorganic composition with substantially uniform refractive index.

FIG. 7 shows measured optical properties, refractive index (a) and extinction coefficient (b), of inorganic layers deposited with varying oxygen mole fraction, obtained by spectroscopic ellipsometry. In this example, depending on the oxygen mole fraction in the precursor feed gases, refractive index of the depositing inorganic material varies from 1.8 to 1.4. Thus, by selecting a process condition, which results in refractive index of depositing inorganic material close to that of organic material, the interference amplitude can be reduced significantly. FIG. 7 also indicates that the extinction coefficient (b) does not change enough to significantly affect the absorption of light through the inorganic layers for thicknesses of inorganic layers used in this invention.

Figure 8:
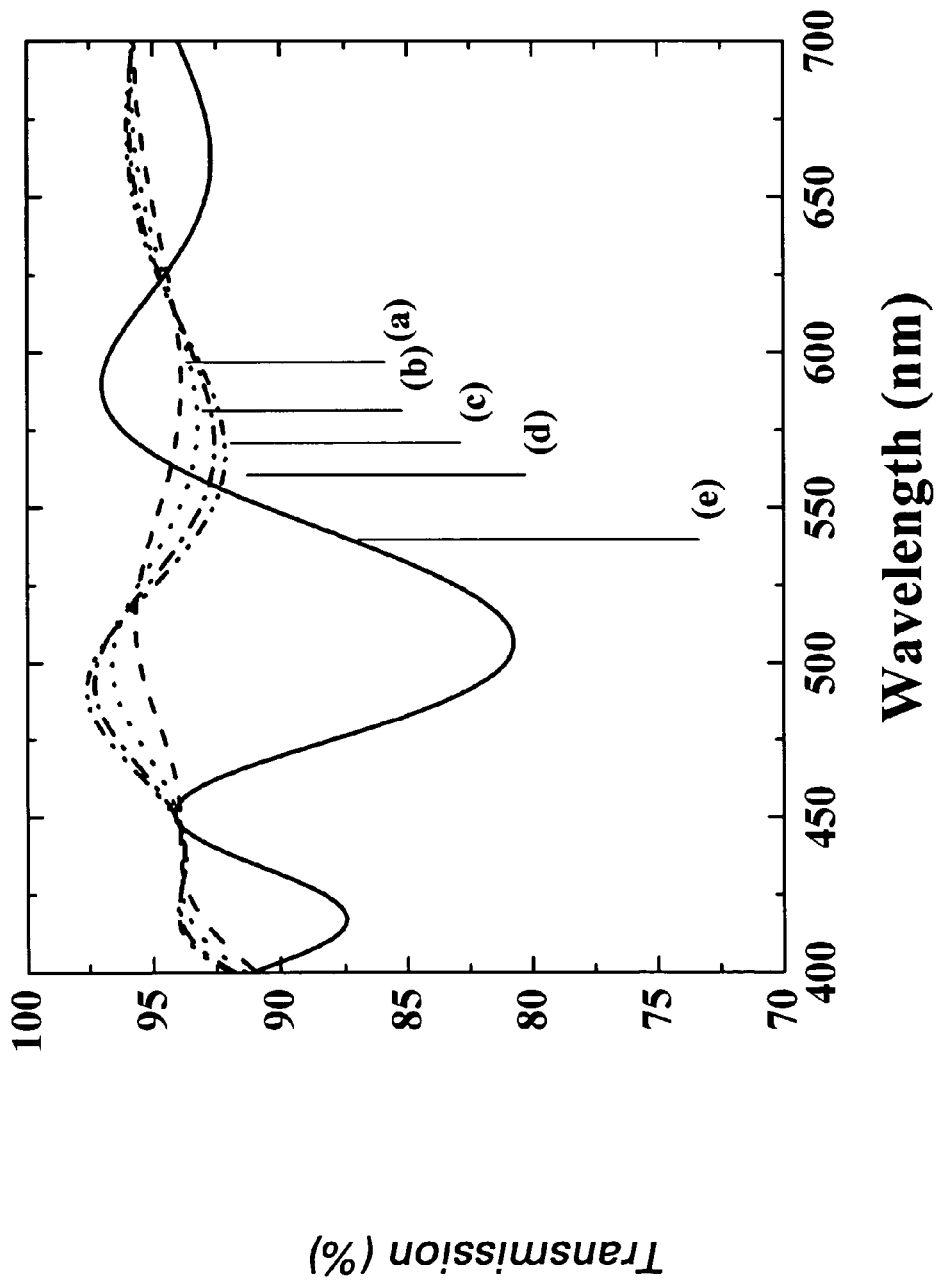
FIG. 8 shows calculated visible light transmittance spectra as a function of oxygen mole fraction in feed gas during deposition.

FIG. 8 shows visible light transmittance spectra through the barrier coating for different oxygen mole fractions 0.0 (a), 0.25 (b), 0.5 (c), 0.75, (d) and 1.0 (e) in precursor feed gas calculated using measured optical properties such as refractive index n and extinction coefficient k. In this example visible light transmittance with minimum interference fringes are achieved at about 0.25 oxygen mole fraction indicating that the refractive index of the inorganic material deposited under this process condition matches the refractive index of the organic material deposited In another embodiment of the present invention, a region between the substrate or element with the coating and the coating is diffuse, such that there is a gradual change from the composition of the bulk of the substrate or element to the composition of the portion of the coating. Such a transition prevents an abrupt change in the composition and mitigates any chance for delamination of the coating. The gradual change of the coating composition is achieved by the gradual change of the precursor composition.

A further aspect of the invention is a device assembly comprising a device, at least one surface of which is coated with at least one barrier coating, the composition of which varies across the thickness of the coating and has substantially uniform refractive index along the axis of light transmission. Such device assemblies include, but are not limited to, liquid crystal displays, light emitting devices, photo-responsive devices, integrated circuits and components of medical diagnostic systems.

The device assembly may comprise a device disposed on a flexible substantially transparent substrate, said substrate having a first substrate surface and a second substrate surface, at least one of said substrate surface being coated with the barrier coating of the present invention.

The barrier coatings of the present invention have many advantages, including being robust against environmentally reactive species, having desirable optical properties and being easily mass-produced. The fundamental advantage of the method of deposition of the present invention is that it enables concurrent control of optical and diffusion properties of barrier coatings by adjusting the deposition parameters. The barrier coatings of the present invention would be useful as barrier coatings in many optical and optoelectronic devices including organic light-emitting devices and organic photovoltaic devices.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A composite article comprising:
   a metal substrate;
   a device disposed on said substrate; and
   a barrier coating of organic-inorganic composition, the barrier coating having optical properties that are substantially uniform along an axis of light transmission, said axis oriented substantially perpendicular to the surface of the coating,
   wherein the barrier coating comprises at least one zone substantially organic in composition and at least one zone substantially inorganic in composition.

2. The composite article of claim 1, wherein the refractive index of the barrier coating is substantially uniform along the axis of light transmission.

3. The composite article of claim 1, wherein light transmittance through the barrier coating, along the axis of light transmission, is greater than 85% for all wavelengths in a selected wavelength range.

4. The composite article of claim 3, wherein light transmittance through the barrier coating is greater than 85% in the selected wavelength range between about 400 nanometers to about 700 nanometers.

5. The composite article of claim 1, wherein said optical properties of said barrier coating comprise substantially uniform light transmittance for all wavelengths within a selected wavelength range.

6. The composite article of claim 5, wherein light transmittance through the barrier coating is substantially uniform for the selected wavelength range between about 400 nanometers to about 700 nanometers.

7. The composite article of claim 1, wherein a transmission rate of oxygen through the barrier coating is less than about 0.1 cm$^3$/(m$^2$ day), as measured at 25.degree. C. and with a gas containing 21 volume-percent oxygen.

8. The composite article of claim 1, wherein a transmission rate of water vapor through the barrier coating is less than about 1 g/(m$^2$ day), as measured at 25.degree. C. and with a gas having 100-percent relative humidity.

9. The composite article of claim 1, wherein the barrier coating comprising zones of substantially homogenous composition.

10. The composite article of claim 9, wherein the barrier coating further comprising transitional zones of mixed organic and inorganic composition.

11. The composite article of claim 1, wherein the barrier coating material is selected from the group consisting of organic, inorganic materials, and combinations thereof.

12. The composite article of claim 11, wherein the inorganic materials are selected from the group consisting of oxide, nitride, carbide, boride and combinations there of elements of Groups IIA, IIIA IVA, VA, VIA, VIIA, IB and IB, metals of Groups IIIB, IVB, and VB and rare-earth metals.

13. The composite article of claim 11, wherein the organic barrier coating material comprising carbon, hydrogen and oxygen.

14. The composite article of claim 13, wherein said organic material further comprising sulfur, nitrogen, silicon and other elements.

15. The composite article of claim 1, wherein said barrier coating is disposed over at least one surface of said substrate.

16. The composite article of claim 1, wherein at least one barrier coating is disposed over at least one surface of said device.

17. The composite article of claim 1, wherein at least one barrier coating encapsulates the composite article.

18. The composite article of claim 1, wherein at least one barrier coating encapsulates said device.

19. The composite article of claim 1, wherein said device is an optoelectronic element.

20. The composite article of claim 19, wherein the optoelectronic element is an organic element.

21. The composite article of claim 19, wherein the optoelectronic element is electroluminescent.

22. The composite article of claim 19, wherein the optoelectronic element is photoresponsive.

23. A device assembly comprising a device and a metal substrate, at least one surface of said device is coated with a barrier coating of organic-inorganic composition; said barrier coating of organic-inorganic composition having substantially uniform refractive index along the axis of light transmission perpendicular to the surface of the coating and said composition varying across the thickness of the coating.

24. The device assembly according to claim 23, wherein said device assembly is selected from the group consisting of light emitting devices, photovoltaic cells, liquid crystal displays, integrated circuits and components of medical diagnostic systems.

25. An apparatus comprising:
   a metal substrate; and
   a coating material on said substrate, said coating material comprising an organic material having a first refractive index and an inorganic material having a second refractive index wherein said first refractive index matches said second refractive index.

26. The apparatus of claim 25 further comprising a device disposed on said substrate.

27. The apparatus of claim 26 wherein said device is selected from the group consisting of: liquid crystal displays, photovoltaic cells, integrated circuits, and components of medical diagnostic systems.

28. The apparatus of claim 26 wherein said device is an organic electroluminescent ("EL") member.

29. The apparatus of claim 28 wherein said EL member is an organic light emitting diode.

30. The apparatus of claim 28 wherein said EL member further comprises a reflective layer comprising material selected from the group consisting of: metals, metal oxides, metal nitrides, metal carbides, metal oxynitrides, metal oxycarbides, and combinations thereof.

31. The apparatus of claim 28 wherein said organic EL member comprises at least an electrode, an organic EL layer, and an additional layer disposed between said electrode and said organic EL layer, said additional layer performing at least a function selected from the group consisting of electron injection enhancement, electron transport enhancement, hole injection enhancement, and hole transport enhancement.

32. The apparatus of claim 26 wherein said coating and said substrate encapsulate said device.

33. The apparatus of claim 26 wherein said coating encapsulates said substrate and said device.

34. The apparatus of claim 25 wherein the inorganic material comprises silicon oxynitride.

35. The apparatus of claim 34 wherein the light transmittance of the coating material is greater than 90 percent.

36. The apparatus according to claim 25 wherein said coating material further comprises material selected from the group consisting of: organic, inorganic, ceramic materials, and combinations thereof.

37. The apparatus according to claim 36 wherein said inorganic and ceramic materials are selected from the group consisting of oxide, nitride, carbide, boride, and combinations thereof of elements of Groups IIA, IIIA, IVA, VA, VIA, VIIA, IB, and IIB, metals of Groups IIIB, IVB, and VB, and rare-earth metals.

38. A composite article comprising:
a glass substrate;
a device disposed on said substrate; and
a barrier coating of organic-inorganic composition, the barrier coating having optical properties that are substantially uniform along an axis of light transmission, said axis oriented substantially perpendicular to the surface of the coating,
wherein the barrier coating comprises at least one zone substantially organic in composition and at least one zone substantially inorganic in composition.

39. The composite article of claim 38, wherein the refractive index of the barrier coating is substantially uniform along the axis of light transmission.

40. The composite article of claim 38, wherein light transmittance through the barrier coating, along the axis of light transmission, is greater than 85% for all wavelengths in a selected wavelength range.

41. The composite article of claim 40, wherein light transmittance through the barrier coating is greater than 85% in the selected wavelength range between about 400 nanometers to about 700 nanometers.

42. The composite article of claim 38, wherein said optical properties of said barrier coating comprise substantially uniform light transmittance for all wavelengths within a selected wavelength range.

43. composite article of claim 42, wherein light transmittance through the barrier coating is substantially uniform for the selected wavelength range between about 400 nanometers to about 700 nanometers.

44. The composite article of claim 38, wherein a transmission rate of oxygen through the barrier coating is less than about $0.1 cm^3/(m^2 day)$, as measured at 25.degree. C. and with a gas containing 21 volume-percent oxygen.

45. The composite article of claim 38, wherein a transmission rate of water vapor through the barrier coating is less than about $1 g/(m^2 day)$, as measured at 25.degree. C. and with a gas having 100-percent relative humidity.

46. The composite article of claim 38, wherein the barrier coating comprising zones of substantially homogenous composition.

47. The composite article of claim 46, wherein the barrier coating further comprising transitional zones of mixed organic and inorganic composition.

48. The composite article of claim 38, wherein the barrier coating material is selected from the group consisting of organic, inorganic materials, and combinations thereof.

49. The composite article of claim 48, wherein the inorganic materials are selected from the group consisting of oxide, nitride, carbide, boride and combinations there of elements of Groups IIA, IIIA, IVA, VA, VIA, VIIA, IB and IB, metals of Groups IIIB, IVB, and VB and rare-earth metals.

50. The composite article of claim 48, wherein the organic barrier coating material comprising carbon, hydrogen and oxygen.

51. The composite article of claim 50, wherein said organic material farther comprising sulfur, nitrogen, silicon and other elements.

52. The composite article of claim 38, wherein said barrier coating is disposed over at least one surface of said substrate.

53. The composite article of claim 38, wherein at least one baffler coating is disposed over at least one surface of said device.

54. The composite article of claim 38, wherein at least one baffler coating encapsulates the composite article.

55. The composite article of claim 38, wherein at least one baffler coating encapsulates said device.

56. The composite article of claim 38, wherein said device is an optoelectronic element.

57. The composite article of claim 56, wherein the optoelectronic element is an organic element.

58. The composite article of claim 56, wherein the optoelectronic element is electroluminescent.

59. The composite article of claim 56, wherein the optoelectronic element is photoresponsive.

60. A device assembly comprising a device and a glass substrate, at least one surface of said device is coated with a barrier coating of organic-inorganic composition; said barrier coating of organic-inorganic composition having substantially uniform refractive index along the axis of light transmission perpendicular to the surface of the coating and said composition varying across the thickness of the coating.

61. The device assembly according to claim 60, wherein said device assembly is selected from the group consisting of light emitting devices, photovoltaic cells, liquid crystal displays, integrated circuits and components of medical diagnostic systems.

62. An apparatus comprising:
a glass substrate; and
a coating material on said substrate, said coating material comprising an organic material having a first refractive index and an inorganic material having a second refractive index wherein said first refractive index matches said second refractive index.

63. The apparatus of claim 62 further comprising a device disposed on said substrate.

64. The apparatus of claim 63 wherein said device is selected from the group consisting of: liquid crystal displays, photovoltaic cells, integrated circuits, and components of medical diagnostic systems.

65. The apparatus of claim 63 wherein said device is an organic electroluminescent ("EL") member.

66. The apparatus of claim 65 wherein said EL member is an organic light emitting diode.

67. The apparatus of claim 65 wherein said EL member further comprises a reflective layer comprising material selected from the group consisting of: metals, metal oxides, metal nitrides, metal carbides, metal oxynitrides, metal oxycarbides, and combinations thereof.

68. The apparatus of claim 65 wherein said organic EL member comprises at least an electrode, an organic EL layer, and an additional layer disposed between said electrode and said organic EL layer, said additional layer performing at least a function selected from the group consisting of electron injection enhancement, electron transport enhancement, hole injection enhancement, and hole transport enhancement.

69. The apparatus of claim 63 wherein said coating and said substrate encapsulate said device.

70. The apparatus of claim 63 wherein said coating encapsulates said substrate and said device.

71. The apparatus of claim 62 wherein the inorganic material comprises silicon oxynitride.

72. The apparatus of claim 71 wherein the light transmittance of the coating material is greater than 90 percent.

73. The apparatus according to claim 62 wherein said coating material further comprises material selected from the group consisting of: organic, inorganic, ceramic materials, and combinations thereof.

74. The apparatus according to claim 73 wherein said inorganic and ceramic materials are selected from the group consisting of oxide, nitride, carbide, boride, and combinations thereof of elements of Groups IIA, IIIA, IVA, VA, VIA, VIIA, IB, and IIB, metals of Groups IIIB, IVB, and VB, and rare-earth metals.

* * * * *